United States Patent [19]

Rein

[11] Patent Number: 5,015,872
[45] Date of Patent: May 14, 1991

[54] METHOD AND CIRCUIT ARRANGEMENT FOR GENERATING A PHASE SHIFTED CLOCK PULSE SIGNAL

[75] Inventor: Hans-Martin Rein, Witten, Fed. Rep. of Germany

[73] Assignee: ANT Nachrichtentechnik GmbH, Backnang, Fed. Rep. of Germany

[21] Appl. No.: 375,686

[22] Filed: Jul. 5, 1989

[30] Foreign Application Priority Data

Jul. 6, 1988 [DE] Fed. Rep. of Germany ....... 3822857

[51] Int. Cl.$^5$ .......................... H03K 5/13; H03K 5/00
[52] U.S. Cl. ..................... 307/269; 307/262; 307/479; 328/63; 328/155; 328/72
[58] Field of Search ............... 307/262, 511, 513, 479, 307/269, 272.2, 471; 328/55, 155; 330/252

[56] References Cited

U.S. PATENT DOCUMENTS 4,160,217  7/1979  Ohsawa ............................... 307/511
4,663,594  5/1987  Perkins ................................ 307/262
4,833,340  5/1989  Deguchi .............................. 320/155

FOREIGN PATENT DOCUMENTS 3546131 12/1985 Fed. Rep. of Germany.
3546132 12/1985 Fed. Rep. of Germany.

OTHER PUBLICATIONS

Dawson and Rogerson, "An Undersea Fiber-Optic Regenerator Using an Ingetral-Substrate Package and Flip-Chip SAW Mounting," *Journal of Lightwave Technology*, vol. LT-2, No. 6, Dec. 1984, pp. 926–932.

Tietze and Schenk, "Halbleiter-Schaltungstechnik," 1978, pp. 9–13.

Primary Examiner—Timothy P. Callahan
Attorney, Agent, or Firm—Spencer & Frank

[57] ABSTRACT

A method and apparatus of generating a clock pulse signal, which is shifted by any desired, settable phase value between 0 and $-\pi$ by using two conventional phase shifters which can be set continuously between 0 and $-9\pi/2$, wherein the two input ports of the first phase shifter are fed with the non-delayed frequency-halved signal and with the frequency-halved signal shifted in phase by $-\pi/2$, respectively, and the two input ports of the second phase shifter are fed with the frequency-halved signal shifted in phase by $-\pi/2$ and $-\pi$, respectively. Both phase shifters are actuated jointly, and subsequently the frequency of the thus phase shifted output signals being doubled again. The output or input signals or both of them of the two controllable phase shifters are each filtered through lowpass filters in such a manner that possibly existing harmonics are attenuated in amplitude relative to the frequency-halved signal whereby dynamic behavior and frequency behavior are improved considerably.

15 Claims, 8 Drawing Sheets

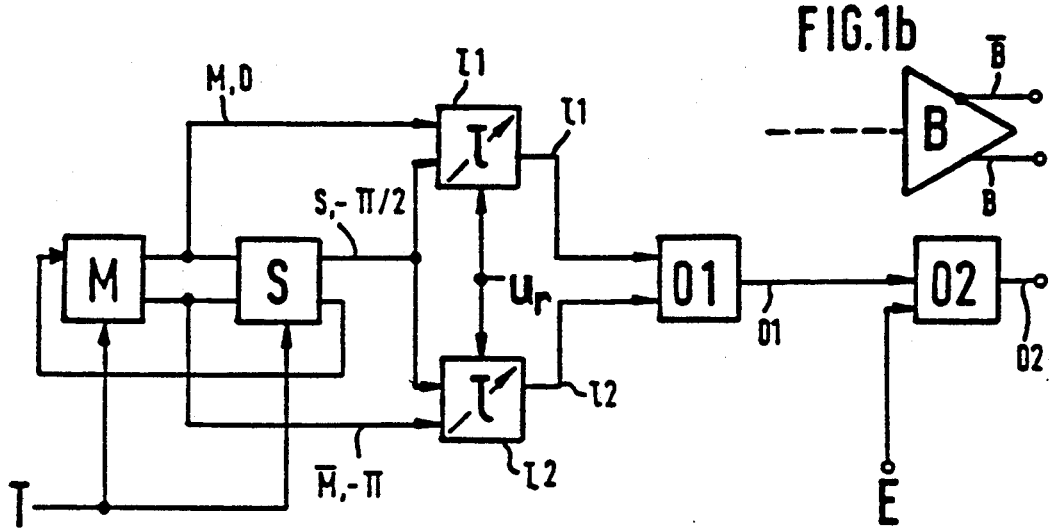
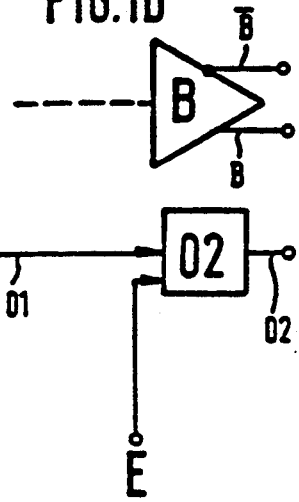
FIG.1a
FIG.1b
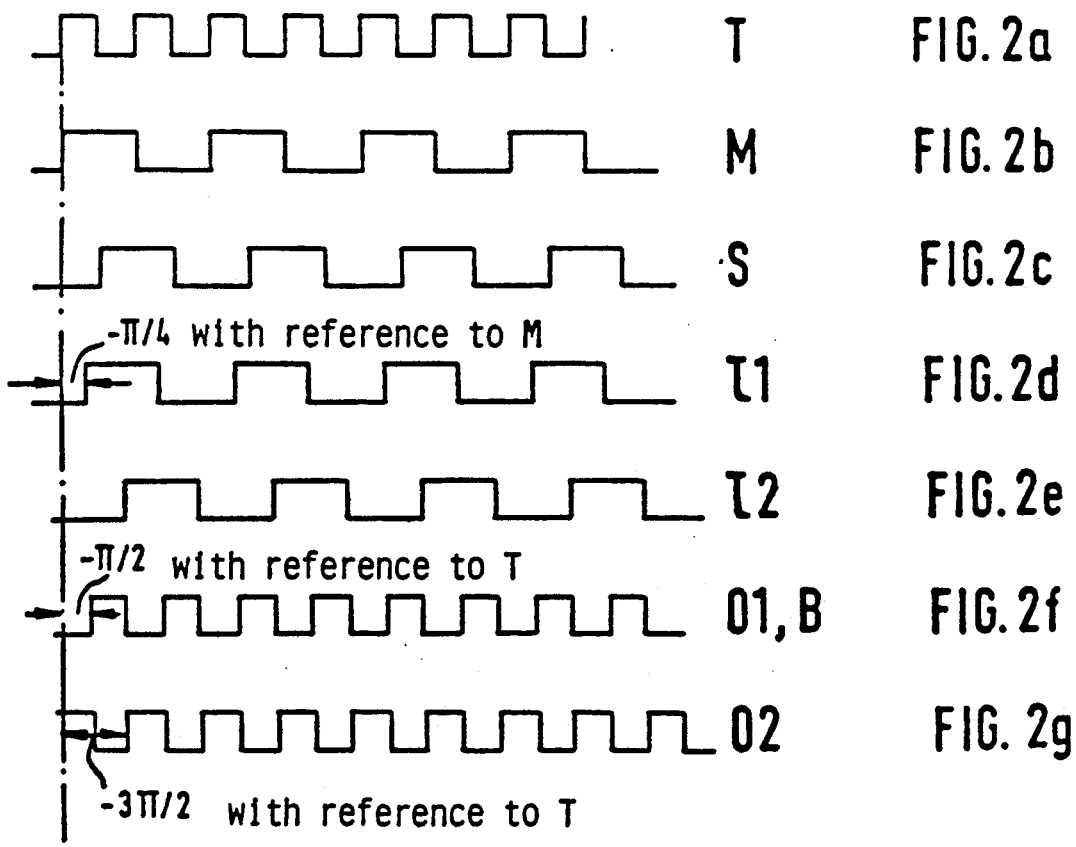

METHOD AND CIRCUIT ARRANGEMENT FOR GENERATING A PHASE SHIFTED CLOCK PULSE SIGNAL

REFERENCE TO RELATED APPLICATIONS

This application claims the priority of Federal Republic of Germany application Serial No. P 38 22 857.2 filed July 6, 1988.

BACKGROUND OF THE INVENTION

The present invention relates to a method of generating a phase shifted clock pulse signal which is shifted in phase by a phase value that can be set as desired between zero and $-\pi$, particularly a high frequency clock pulse signal, employing conventional continuous phase shifters which can be set between zero and $-\pi/2$ and $-3\pi/4$, respectively, with the frequency of the original signal (T) being divided in half by means of a frequency divider and generating phase shifts of this frequency-halved signal being generated at 0, $-\pi/2$ and $-\pi$. According to the method two such controllable phase shifters each generate a signal and are continuously adjustable in phase to a value in a range between the phase of the first input signal and the phase of a second input signal in such a manner that the first phase shifter is fed at its first input with the undelayed frequency-halved signal and at its second input with the frequency-halved signal shifted in phase by $-\pi/2$; and the second phase shifter is fed at both its inputs with the frequency-halved signal which is shifted in phase by $-\pi/2$ and $-\pi$, respectively, both phase shifters being controlled jointly by a control voltage ($u_r$) to thus be able to generate any desired, predeterminable, continuous phase values in a range from 0 to $-\pi/2$ and from $-\pi/2$ to $-\pi$, with thereafter the frequency of the thus phase shifted signals being doubled again so that phase shift values between 0 and $-\pi$ with reference to the frequency of the original signal (T) result. That the output and/or input signals of the two controllable phase shifters are each filtered in a lowpass filter in such a manner that possibly existing harmonics are attenuated in amplitude with respect to the frequency-halved signal.

The present invention also relates to a circuit arrangement for generating a clock pulse signal, particularly a high frequency clock pulse signal, which is shifted in phase by phase values which can be set as desired between 0 and $-\pi$ by employing phase shifters each able to generate a signal whose phase can be continuously adjusted to a value in a range between the phase of a first input signal and the phase of a second input signal, with a master-slave D-flip-flop supplemented by an inverted feedback so as to form a ring being provided as the frequency divider to whose clock pulse input the signal (T) to be shifted is fed. Either the master or the slave output signals exhibit phase shifts of 0 and $-\pi$ while the other of the master and slave output signals exhibits the phase value $-\pi/2$, with two phase shifters being provided. In a circuit of this type, the phase shifters are controlled jointly by one control signal ($u_r$), the two inputs of the one phase shifter are charged by the undelayed frequency-halved signal and by the frequency-halved signal delayed by $-\pi/2$, respectively, the two inputs of the other phase shifting member are charged by the frequency-halved signal delayed by $-\pi/2$ and $-\pi$, respectively, an exclusive OR member is provided whose inputs are connected with the outputs of the two phase shifters and the output signal of the exclusive OR member is the desired signal which is shifted in phase by a value within a range from 0 to $-\pi$ with reference to the phase and frequency of the input signal (T). The invention also relates to a similar circuit arrangement but wherein a reset flip-flop is provided instead of the exclusive OR member and has an inverting input and an inverting output and inputs which are connected with the outputs of the two phase shifters, and the inverted or the non-inverted output signal of the flip-flop is the desired signal which is shifted in phase by a value within a range from 0 to $-\pi$ and from $-\pi$ to $-2\pi$, respectively, with reference to the phase and frequency of the input signal (T).

One possible use of such a method and apparatus is for electrical regenerators in optical transmission systems.

Phase shifters of the customary type permit phase shifts in a range from 0 to about $-120°$. Also see the article "An Undersea Fiberoptic Regenerator Using an Integral Substrate Package and Flip-Chip SAW Mounting" by Dawson and Rogerson, Journal of Lightwave Technology, Vol. LT-2, No. 6, December, 1984, pages 926-932.

The invention provides a method and a circuit arrangement which are able to continuously perform phase shifts in a range between 0 and $-\pi$ over a broad frequency range without it being necessary to tune the circuit. With customary phase shifters, the circuit must be matched in each case—even in the above-mentioned Dawson and Rogerson publication—to the signal frequency.

The method and the circuit arrangement permit any desired continuous phase shift in a range between 0 and $-\pi$, with the costs for this being relatively low. This requires neither internal matching nor external elements, for example delay lines, which would each have to be adapted to the signal frequency, for example by appropriately setting the length of a delay line. Rather, the phase shift occurs nearly independently of the signal frequency. This results in a further advantage over conventional phase shifters, namely simple monolithic integratability of the circuit, which leads to a considerable reduction in costs.

SUMMARY OF THE INVENTION

It is an object of the present invention to maintain the continuity of the phase shifts even for high amplitude input signals (that is, if there is a danger that the input stages of the phase shifters employed could be overshot) or for rectangular signals, without unduly increasing additional costs. Moreover, the invention has the advantage of monolithic integratability.

This problem is solved by modifying the method and circuit arrangement according to the invention so as to provide that the output and/or input signals of the two controllable phase shifters are each filtered in a lowpass filter in such a manner that possibly existing harmonics are attenuated in amplitude with respect to the frequency-halved signal.

One aspect of the present invention is based on the consideration that if the phase shifters of Dawson and Rogerson (see above cited article, page 939, FIG. 5, or the circuit arrangement according to FIG. 3 of the present application) are employed, unfavorable output signals may occur if the phase shifters are used with rectangular input signals or with high amplitude input signals. These effects occur primarily far below the upper frequency limit of the circuit and may lead, for example, to step-shaped output signals. This causes the zero passages of the output voltage not to be shifted sufficiently steadily with the control voltage and, in the extreme case, the rising slope may disappear in the zero passage once the control voltage becomes zero. These effects are illustrated in FIG. 4 by the input and output signals of the phase shifting circuit plotted over time. They interfere, for example, if the signal at the output of the phase shifter is to be regenerated or doubled in frequency and regenerated. In the circuit arrangement proposed of FIG. 1a, these effects can be eliminated (while maintaining the monolithic integratability) by placing a lowpass filter at the outputs of each of the two phase shifters. The lowpass filter here attenuates the amplitude of the harmonics with reference to the fundamental frequency (i.e. the frequency of the signal whose frequency has been cut in half at the outputs of the preceding master-slave flip-flop M, S).

The EXOR gate following at the outputs of phase shifters $\pi1$, $\pi2$ (see FIG. 1a) regenerates the signal while simultaneously doubling the frequency. Lowpass filters can also be put at the two signal inputs of the phase shifters, but in that case, linearization requires that a series feedback produced, for example, by resistors connected in series with the emitters, be provided if the circuit is driven heavily so as to avoid overdriving of the phase shifters.

In the simplest case, the lowpass function can be realized by a capacitance connected in parallel with the output of the phase shifters (see FIG. 5). (If the circuit is operated in the vicinity of its upper frequency limit, the parasitic capacitances of the transistors prevent the occurrence of rectangular pulses so that this measure is not required.)

Another improvement of phase shifting requires the provision of a temperature coefficient TC. This is of advantage if the natural temperature coefficient of the clock pulse shifting circuit itself or, more precisely, the temperature coefficient of the circuits controlled by this circuit, is to be compensated. Such a temperature coefficient can be set in that the control voltage $u_r$ according to FIGS. 3, 5 or 6, respectively, is provided with a suitable positive or negative temperature coefficient which is possible in conventional circuit concepts. For example, the temperature coefficient of the forward voltage of a PN diode may be utilized for this purpose.

BRIEF DESCRIPTION OF THE DRAWINGS

These and other aspects of the invention will be more fully understood from the following detailed description of the preferred embodiments with reference to the accompanying drawing figures in which:

FIGS. 1a, 1b and 1c illustrate an embodiment for a phase shifting circuit arrangement according to the invention.

FIGS. 2a to 2g are pulse diagrams plotted over time for signals at various points of the circuit of FIGS. 1a and 1b;

DETAILED DESCRIPTION OF THE PREFERRED EMBODIMENTS

Figure 1C:
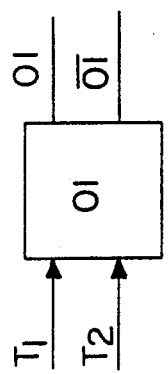

The invention is based on the idea of coupling a master-slave D-flip-flop in a known manner into a cascade ring in order for it to operate as a frequency divider and then furnish clock pulses at one-half the frequency with a phase of zero, $-\pi/2$ and $-\pi$, with reference to the halved frequency, if the output ports of the slave (S) as well as the output ports of the master (M) are employed. Such a cascade controlled by an input clock pulse T is disclosed in German Patentschrift DE 35 46 131 issued Aug. 31, 1989, and German Offenlegungsschrift DE 35 46 132, published July 2, 1987, 35 46 132 and can be seen on the left of FIG. 1a.

Clock pulse T is plotted over time in FIG. 2a. Clearly visible are the output signals of master flip-flop M of FIG. 2b with a zero phase and the output of slave flip-flop S with a phase of $-\pi/2$, shown in FIG. 2c. These two signals M and S are fed to the two input ports (input A and input B) of a first phase shifting member $\tau1$ of conventional structure; see FIG. 5 at page 929 of the above-cited Dawson and Rogerson publication. Corresponding with the set control voltage $u_r$ (control $V_{in}$), the phase shifting member generates a signal at its output port ($V_{out}$) which can be set continuously as desired between a zero phase and a phase of $-\pi/2$. The output signal $\tau1$ according to FIG. 2d, here again plotted over time, has a phase of approximately $-\pi/4$, that is, it lies somewhat in the middle of the controllable range. A second phase shifting member $\tau2$, which is of the same type and receives the slave signal S, i.e. phase $-\pi/2$, at its first input port and the inverted master signal $\overline{M}$, i.e. phase $-\pi$, at its second input, generates a signal $\tau2$ at its output port which, depending on control voltage $u_r$, is able to continuously traverse the range from $-\pi/2$ to $-\pi$. Now the two phase shifters $\tau1$ and $\tau2$ are actuated jointly by the same control voltage, thus making it possible to hold the phase difference between $\tau1$ and $\tau2$ constantly at $\pi/2$. The output signal $\tau2$ at the output port of the second phase shifter is plotted over time in FIG. 2e.

The two output signals of phase shifting members $\tau1$ and $\tau2$ still have the halved frequency. According to FIG. 1a, the frequency is subsequently doubled by means of an exclusive OR member 01. At the output port of this EXOR member, there now appears a signal which has the frequency of clock pulse T at the input but, in this embodiment, is shifted in phase by a value of about $-\pi/2$ with reference to this frequency (see the time diagram 01 of FIG. 2f). The phase can now be shifted within a range from 0 to $-\pi$. The output voltage of phase shifters $\tau1$ and $\tau2$ which is somewhat reduced (by about 30%) in the middle of the phase shifting range is generally regenerated by EXOR member 01 back to the binary unity level (0 and 1, respectively). If necessary, buffer amplifiers may be connected to the output ports of the two phase shifters or the EXOR member (not shown in FIG. 1a).

Connected to the output port of EXOR member 01 is a further exclusive OR member 02 which may be switched at its second input E. If the binary value 0 is present at this input E, a signal is generated which is shifted in phase by 0 to $-\pi$, but if the binary value 1 appears at input port E, a signal 02 is generated at the output port of the second EXOR member (see FIG. 2g) which is in phase opposition, i.e. is shifted in phase by $-\pi$. This, however, broadens the phase shifting range from zero to $-\pi$ to a range from $-\pi$ to $-2\pi$.

Thus, this circuit arrangement makes possible a continuous phase shift over a range from zero to $-2\pi$. Of course, instead of the second EXOR member 02, an inverter can also be used so that, as required, its output signal or the output signal of EXOR member 01 can be utilized for further processing.

However, the inverter may be disadvantageous insofar as it involves additional delays which have an interfering effect on higher frequencies. Therefore it is often more favorable to employ a buffer B which, in addition to its normal output, has an inverting output (see FIG. 1b) and in which the signal delay between its input port and one of its two output ports is the same. In this case, a smooth transition between the two phase ranges 0 ... $-\pi$ and $-\pi$ ... $-2\pi$ is possible without overlapping. Such circuits are customary, for example, in the known ECL circuit technology. Under certain circumstances, an inverter or a buffer stage with additional inverting output may not be necessary if EXOR member 01—as possible, for example, in ECL circuit technology—has an inverting output 01 in addition to its normal output 01 (see FIG. 1c).

It is of course also possible to effect a phase shift over the entire range from 0 to $2\pi$ if two complete circuits according to FIG. 1a (input T, output 01) are connected in series and all $2 \times 2 = 4$ phase shifters are controlled by the same control voltage $u_r$.

Another possibility is to employ an RS flip-flop instead of branch 01, B, 02. The set and reset input ports of this flip-flop are then charged by the output signals of the two phase shifting members $\tau 1$ and $\tau 2$. The desired signals shifted in phase by 0 to $-\pi$ and $-\pi$ to $-2\pi$, respectively, can then be picked up at its inverted and non-inverted output ports.

Figure 3:
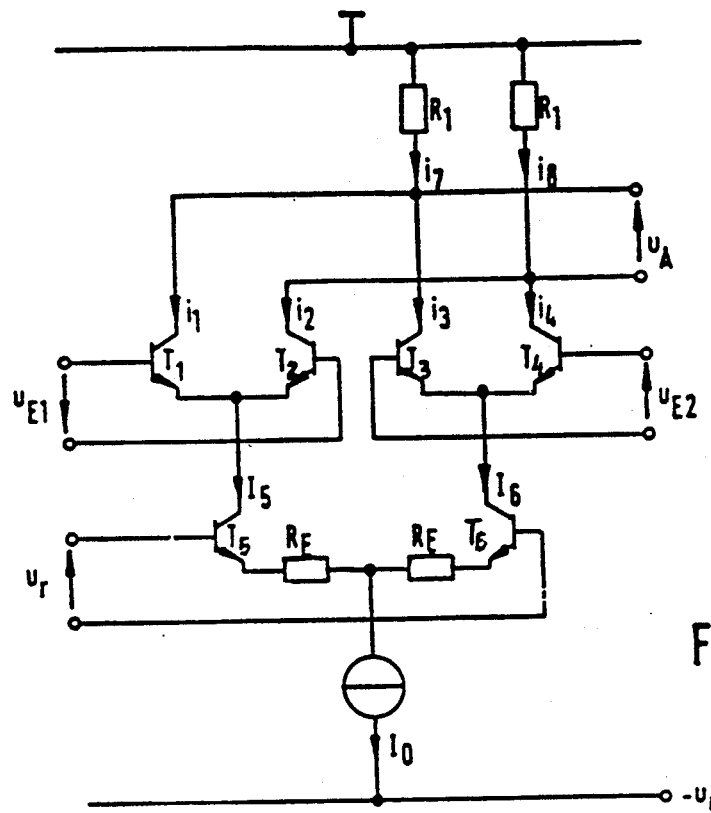
FIG. 3 is a circuit diagram of a prior art phase shifter.

FIG. 3 shows the basic concept of an adjustable phase shifter of the conventional type.

Figure 4:
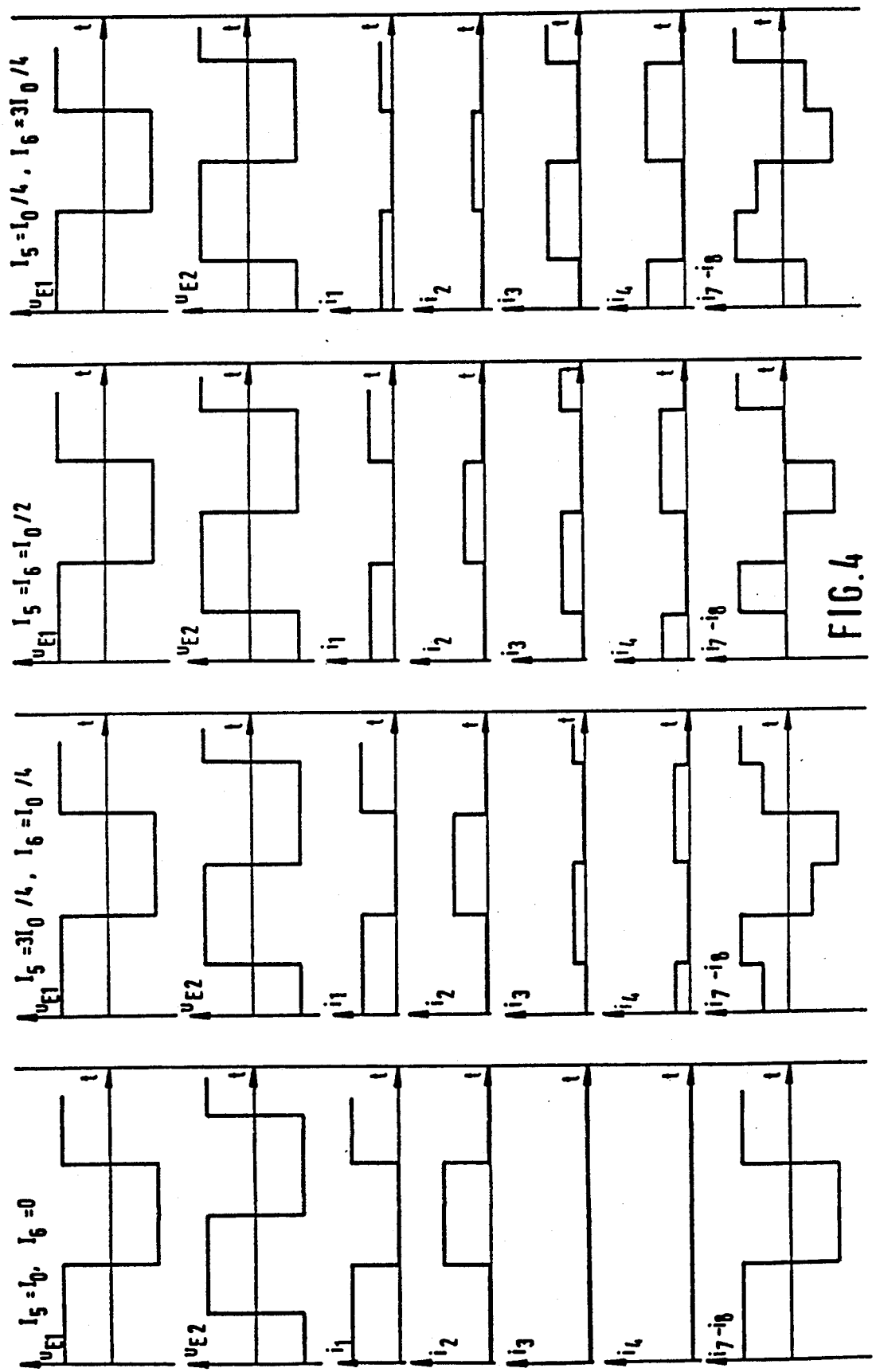
FIG. 4 shows a few associated difference currents in the circuit of FIG. 3, plotted over time.

FIG. 4 shows, plotted over time, the difference output currents $i_7$ minus $i_8$ of the phase shifter for various current divisions $I_5$ to $I_6$ flowing into the two input stages as shown in FIG. 3. Also plotted, likewise over time, are the input voltages $u_{E1}$ and $u_{E2}$ for the two input stages and their output currents $i_1$, $i_2$ and $i_3$ and $i_4$, respectively.

As already indicated above, the phase shifter shown in FIG. 3 is suitable only to shift sinusoidal-like clock pulse signals which do not have too high an amplitude. If the two input voltages $u_{E1}$ and $u_{E2}$ are rectangular or the circuit is considerably overdriven, the curves of the output currents $i_1$ to $i_4$ from these two stages become approximately rectangular. This results in a difference output current $i_7$ minus $i_8$ which has a step-shaped curve. Due to the relationship of output voltage $u_A = R_1 \cdot (i_7 - i_8)$, output voltage $u_A$ thus also becomes step-shaped. The control voltage $u_r$ which divides the input current $I_0$ into $I_5$ and $I_6$ determines the levels of the output voltage stages. If one considers the zero passages of input voltage $u_{E1}$ and output voltage $u_A$, the phase angle $\phi$ between these two voltages shown in FIG. 4 can be determined as follows:

$\phi = 0$ for $u_r < 0$ and $\phi = \Phi$ for $u_r > 0$ where $\Phi$ is the phase angle between $u_{E1}$ and $u_{E2}$.

Figure 6:
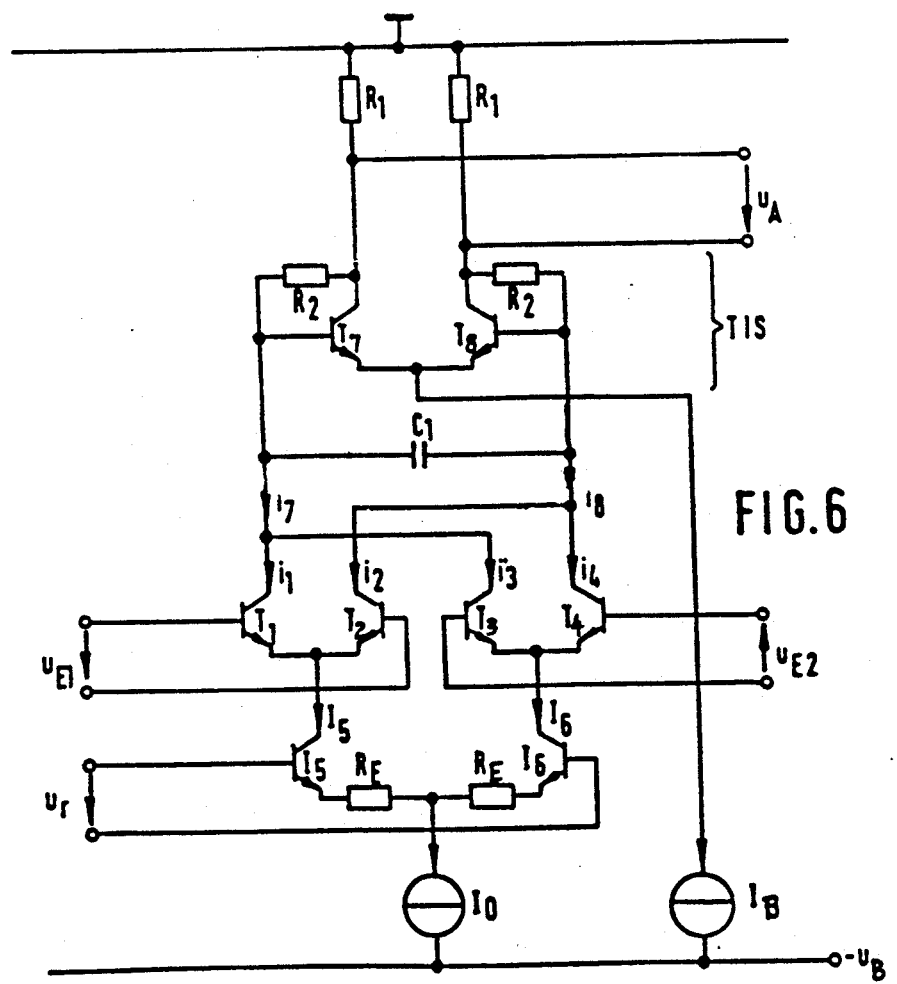
FIGS. 5 and 6 depict further circuit embodiments according to the invention.
Figure 5:
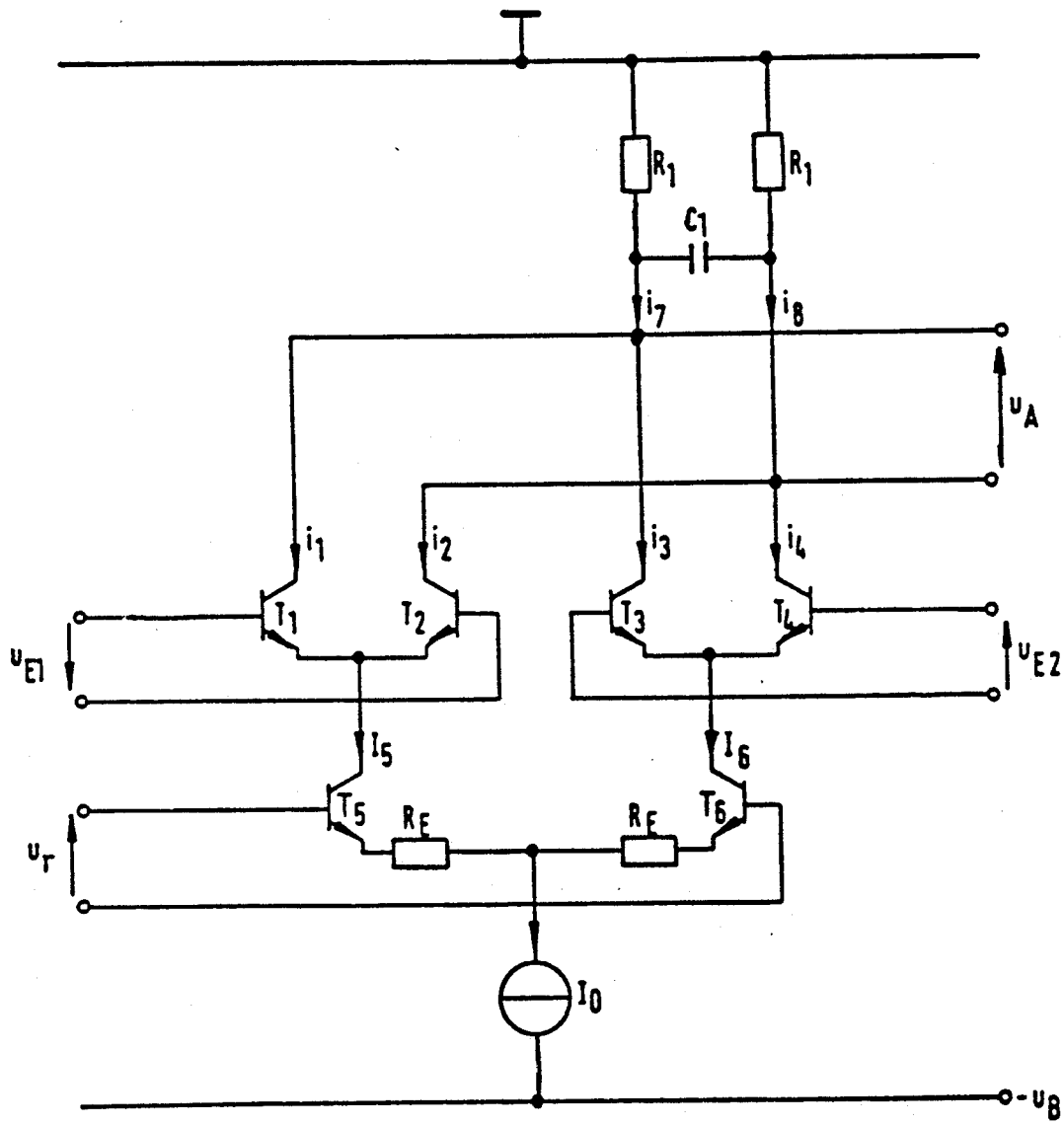
Figure 7:
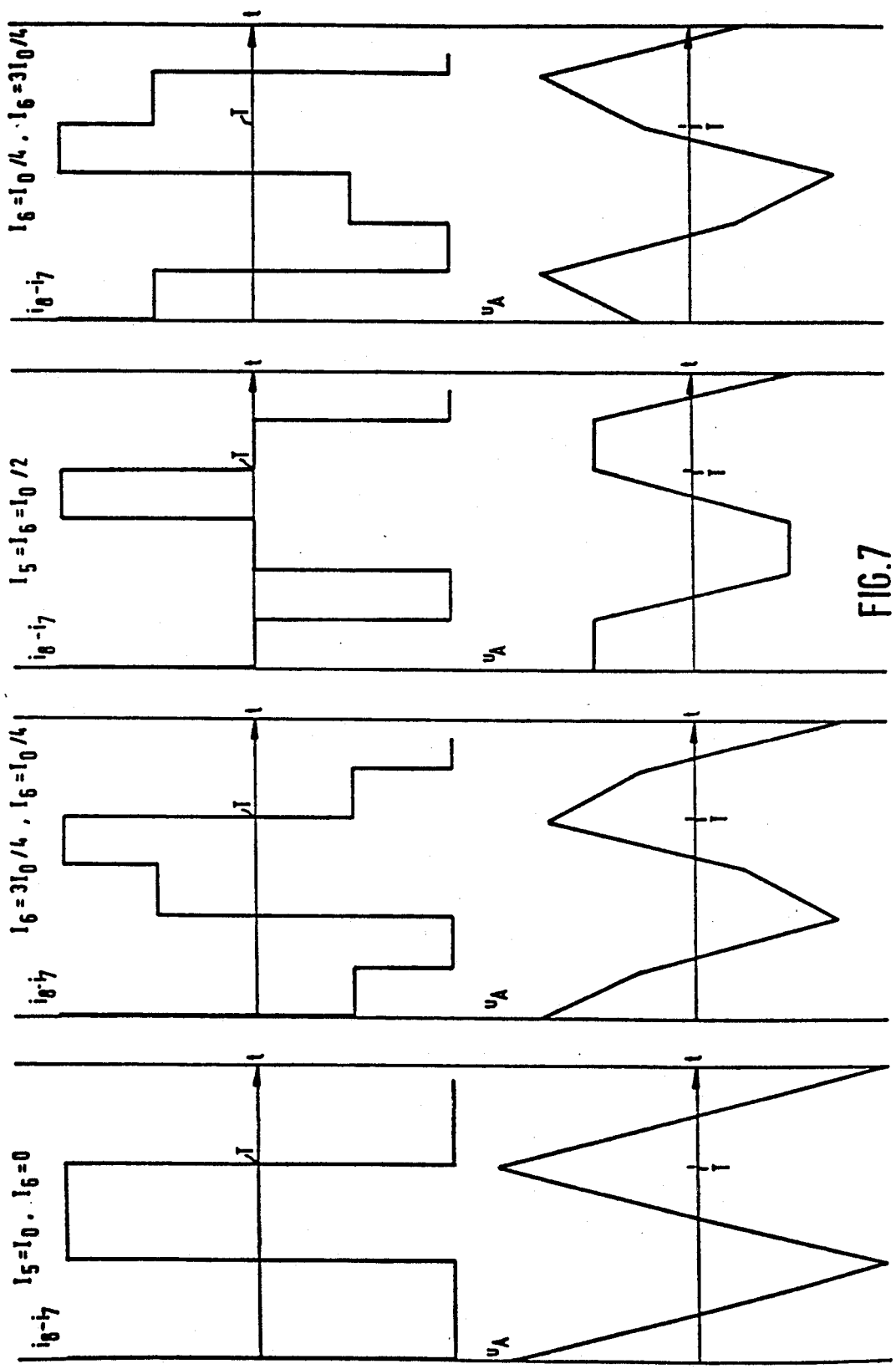
FIGS. 7 and 8 show a few associated voltages and currents for significant points of these circuits, plotted over time.
Figure 8:
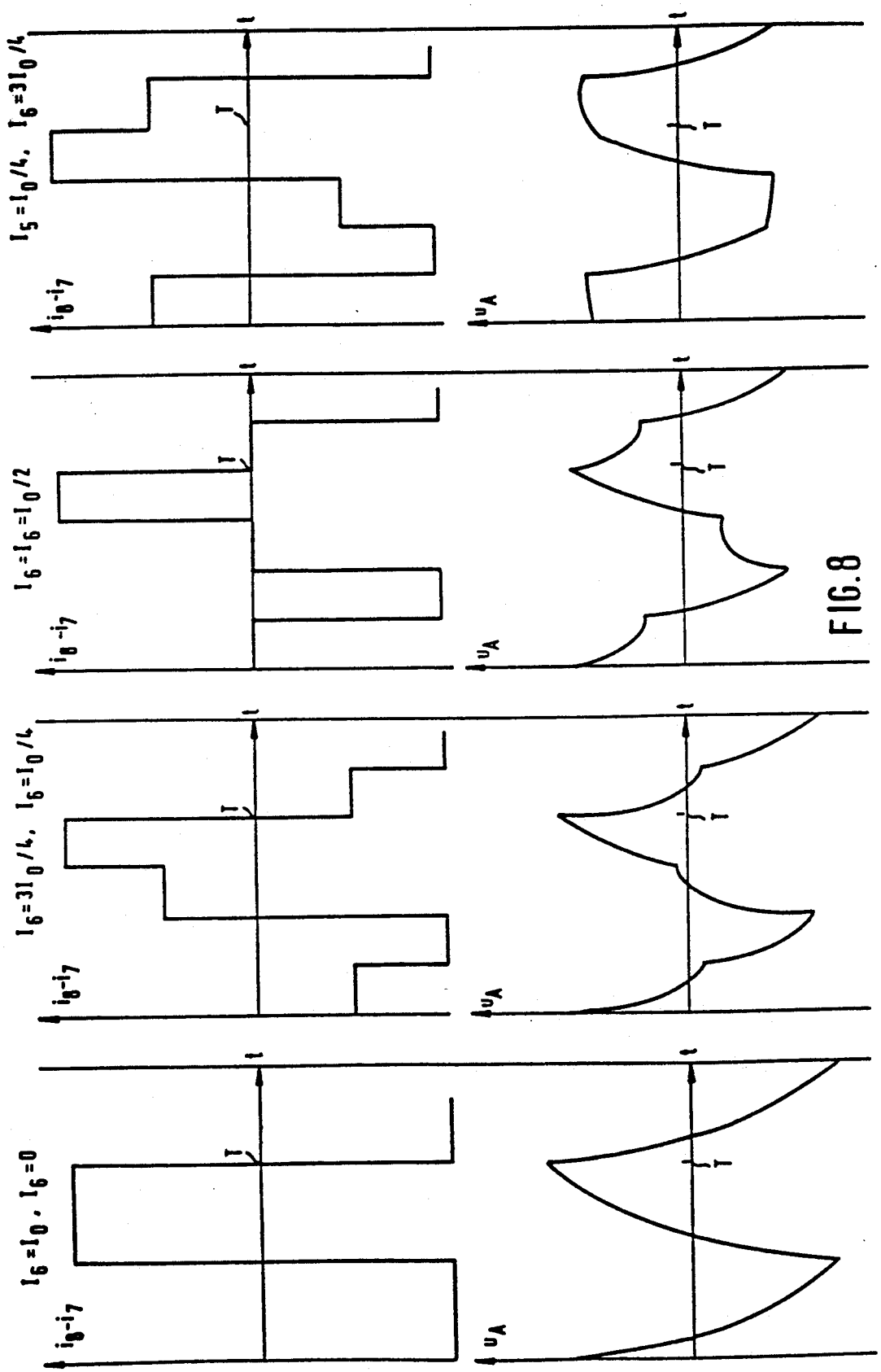

For $u_r = 0$, the output voltage $u_A$ equals zero in certain regions, i.e. it has no distinct zero passages. Thus, even after regeneration of the signal, no phase shift can be determined between the output and input voltages of the phase shifter. For input signals having a rectangular shape or a high amplitude, this circuit concept does not permit continuous phase shifting. Thus, the phase shifting circuit of FIG. 3 cannot simply be used, without modifications, as a component of the broadband phase shifter shown in a block circuit diagram in FIG. 1a, since at low frequencies the output voltages of master-slave flip-flop M, S are rectangular. The concept of a phase shifting circuit which operates also if controlled by rectangular signals is shown in FIGS. 5 and 6. The difference between it and the circuit shown in FIG. 3 is the use of a lowpass filter at the circuit output. With suitable dimensions of the elements in FIG. 5 comprising resistors R1 and capacitor $C_1$, the fundamental mode of the step-shaped voltage is obtained predominantly at the circuit output while the harmonics are substantially filtered out. Capacitance $C_1$ is then the total capacitance including the parasitic capacitances of transistors $T_1$ to $T_4$ of the two input stages and the input capacitance of the connected EXOR gate. If $R_1$ is dimensioned to be high-ohmic, the phase shifter output constitutes an ideal integrator whose output voltage is shown in FIG. 7 for various current relationships $I_5$ to $I_0$ and $I_6$ to $I_0$. FIG. 8 is an illustration of the output voltage for various current relationships $I_5$ to $I_0$ and $I_6$ to $I_0$ for a non-ideal case, i.e. not for the borderline case of an ideal integrator. In this dimensioning example, capacitance $C_1$ has been selected too small or, in other words, the operating frequency is too low.

Another circuit employing a lowpass filter at the output is the phase shifter shown in FIG. 6 in which a transimpedance stage (TIS) with its negative-feedback resistors $R_2$ is included subsequent to capacitor $C_1$ for regeneration of the signal, especially at higher frequencies, thus enabling the permissible frequency range to be expanded.

Figure 9:
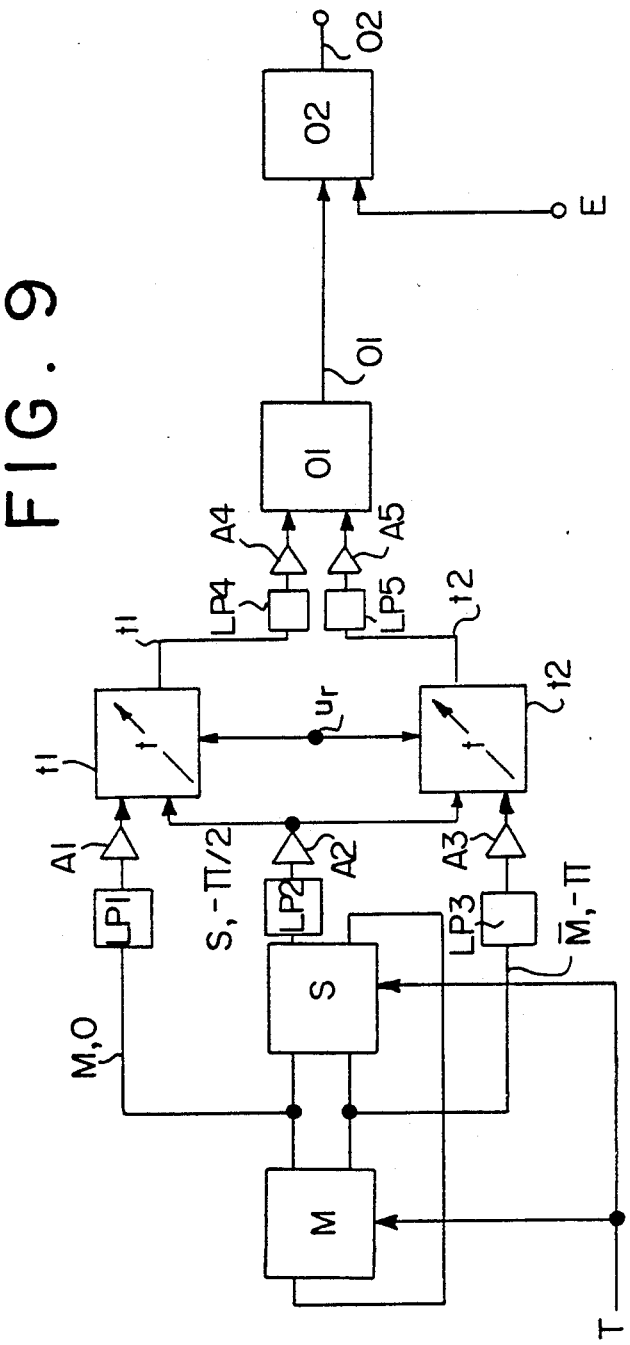
FIG. 9 is a circuit diagram of a further embodiment of the invention.

FIG. 9 shows a further embodiment of the invention in which lowpass filters LP1, LP2 and LP3 and amplifiers A1, A2 and A3 are provided at the input ports of the two phase shifters, and further lowpass filters LP4 and LP5 and amplifiers A4 and A5 are provided at the output ports of the two phase shifters.

Figure 10:
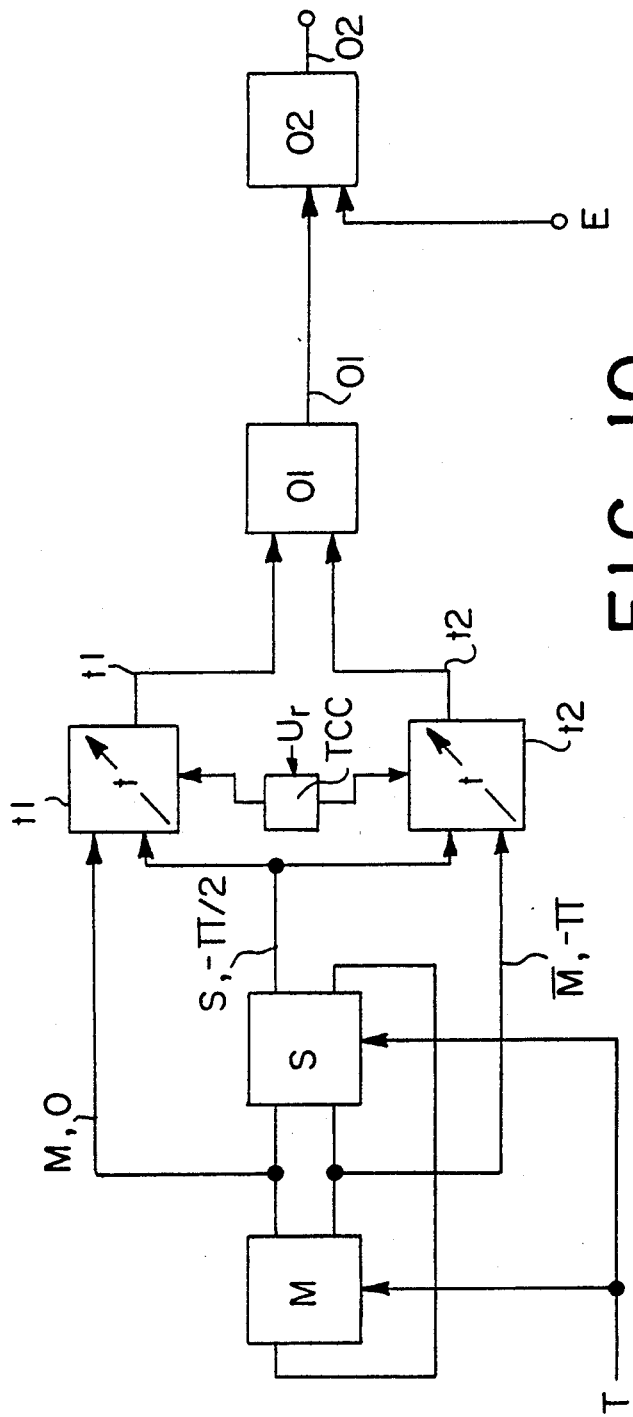

FIG. 10 illustrates an embodiment of the invention in which the temperature coefficient of the phase shifting circuits are controlled by providing the control voltage $u_r$ with a temperature coefficient using a temperature compensation circuit TCC connected to the common input port of the two phase shifters for the common control signal $u_r$.

It will be understood that the above description of the present invention is susceptible to various modifications, changes and adaptations, and the same are intended to be comprehended within the meaning and range of equivalents of the appended claims.

What is claimed is:

1. A method of generating a clock pulse signal which is shifted in phase by a phase value that can be set as desired between zero and $-2\pi$, using first and second continuous phase shifters which are settable between zero and $-\pi/2$ and $-3\pi/4$, respectively, comprising the steps of:

dividing the frequency of an original signal in half with a frequency divider;

generating phase shifts of the frequency-halved signal at 0, $-\pi/2$ and $-\pi$;

generating a first variably phase shifted signal by shifting the phase of the frequency-halved signal by between 0 and $-\pi/2$;

generating a second variable phase shifted signal by shifting the phase of the frequency-halved signal by between $-\pi/2$ and $-\pi$, said step of generating a first variably phase shifted signal including the steps of inputting to first and second input ports of a first controllable phase shifter respectively the unshifted frequency-halved signal and the frequency-halved signal phase shifted by $-\pi/2$ and adjustably controlling the phase of a first output signal of the first controllable phase shifter with a control signal thereby to generate any desired, predeterminably continuous phase values in a range from 0 to $-\pi/2$, said step of generating a second variably phase shifted signal including the steps of inputting to first and second input ports of a second controllable phase shifter respectively the frequency-halved signal phase shifted by $-\pi/2$ and the frequency-halved signal phase shifted by $-\pi$ and adjustably controlling the phase of a second output signal of the second controllable phase shifter with the same control signal as for the first phase shifter, thereby to generate any desired, predeterminable phase values in a range from $-\pi/2$ to $-\pi$; and thereafter doubling the frequency of the first and second variably phase shifted signals to obtain phase shifted values between 0 and $-\pi$ with reference to the frequency of the original signal result.

2. A method as in claim 1, wherein said steps of dividing the frequency of the original signal in half and generating phase shifts of the frequency-halved signal at 0, $-\pi/2$ and $-\pi$ are performed with a master-slave D-flip-flop cascade having a master and a slave, the cascade being supplemented by an inverted feedback to form a ring, the steps of generating the first and second variable phase shifted signals including the steps of applying output signals of both the slave and the master to input ports of the first phase shifter and to input ports of the second phase shifter.

3. A method as defined in claim 1, wherein said step of doubling the frequency is performed with an exclusive OR member having two input ports and wherein said step of doubling comprises the step of feeding the two input ports of the exclusive OR member with output signals of the first and second phase shifters.

4. A method as in claim 3, further comprising the step of additionally generating the output signal of the exclusive OR member in inverted form.

5. A method as in claim 1 further comprising the step of amplifying the low pass filtered signals.

6. A circuit for generating a phase shifted clock pulse signal, comprising:

a frequency divider having a clock pulse input for receiving a signal to be phase shifted, including a master-slave D-flip flop having a master and a slave, an inverted feedback from the slave to the master forming a ring, one of the master and slave having first and second master-slave output signals whose frequency is equal to halve of the frequency of the clock pulse input and whose phases are respectively shifted by 0 and $-\pi$, and the other of the master and slave having a third master-slave output signal whose frequency is equal to halve of the frequency of the clock pulse input and a phase shifted by $-\pi/2$;

first and second phase shifters jointly controlled by a single control signal, said first phase shifter having first and second input ports respectively coupled to the first and third master-slave output signals, said second phase shifter having third and fourth input ports respectively coupled to the second and third master-slave output signals, said first phase shifter being responsive to the control signal for adjusting the phase of a first phase shifter output signal to any value between the respective phases of the first and third master-slave output signals, depending on the value of the control signal, said second phase shifter being responsive to the control signal for adjusting the phase of a second phase shifter output signal to any value between the respective phases of the second and third master-slave output signals, depending on the value of the control signal; and a first exclusive or member having input ports respectively coupled to output ports of said first and second phase shifters so as to receive the first and second phase shifter output signals and provide an output signal which has a phase which is shifted by a desired value depending on the value of the control signal, in the range zero to $-\pi$ with reference to the phase of the clock pulse input.

7. A circuit as in claim 6, further comprising a buffer amplifier connected to an output port of said first exclusive OR member.

8. A circuit as in claim 6, further comprising first and second amplifiers respectively coupling the output ports of said first and second phase shifters to the input ports of said first exclusive OR member.

9. A circuit as in claim 6, wherein said first exclusive OR member has an inverting output port for outputting a signal which has a phase which is shifted by a desired value depending on the value of the control signal, in the range $-\pi$ to $-2\pi$ with reference to the phase of the clock pulse input.

10. A circuit as in claim 7, wherein said buffer amplifier has an inverting output port and a noninverting output port.

11. A circuit as in claim 6, further comprising a second exclusive OR member coupled at one input port thereof to an output port of said first exclusive OR member, whereby by application of a binary signal to a second input port of said second exclusive OR member, the phase of the output port of said second exclusive OR member is switchable between a phase range from 0 to $-\pi$ and a phase range from $-\pi$ to $-2\pi$.

12. A circuit as in claim 6, wherein said first and second phase shifters each include a temperature compensation circuit connected to an input port for the common control signal so to provide a temperature coefficient for each of said first and second phase shifters.

13. An apparatus as in claim 12, further comprising amplifiers connected to output ports of said lowpass filter means.

14. A method as in claim 1, further comprising lowpass filtering at least one of the output and input signals of the first and second controllable phase shifters so as to attenuate in amplitude any existing harmonics with respect to the frequency-halved signal.

15. A circuit as in claim 6, further comprising lowpass filter means coupled to the input ports or the output ports or both the input and the output ports, of said first and second phase shifters, for lowpass filtering the first, second and third master/slave output signals and/or the first and second phase shifter output signals, so as to attenuate the amplitude of harmonics of the first, second and third master/slave output signals and/or of the first and second phase shifter output signals.

* * * * *